(12) United States Patent
Cheyne et al.

(10) Patent No.: US 8,355,255 B2
(45) Date of Patent: Jan. 15, 2013

(54) COOLING OF COPLANAR ACTIVE CIRCUITS

(75) Inventors: Scott R. Cheyne, Brookline, NH (US); Jeffrey Paquette, Wakefield, MA (US); Mark Ackerman, Sudbury, MA (US)

(73) Assignee: Raytheon Company, Waltham, MA (US)

( * ) Notice: Subject to any disclaimer, the term of this patent is extended or adjusted under 35 U.S.C. 154(b) by 217 days.

(21) Appl. No.: 12/975,731

(22) Filed: Dec. 22, 2010

(65) Prior Publication Data
US 2012/0162922 A1      Jun. 28, 2012

(51) Int. Cl.
*H05K 7/20* (2006.01)
*F28F 9/013* (2006.01)

(52) U.S. Cl. ............. 361/719; 361/679.46; 361/679.53; 361/679.54; 361/704; 361/721; 165/80.4; 165/104.33; 165/185; 333/260; 342/373; 342/375; 343/853; 343/700 MS

(58) Field of Classification Search ............... 361/679.46–679.54, 688, 689, 361/699–702, 704–712, 715–722; 165/80.2, 165/80.3, 80.4, 80.5, 104.33, 104.34, 185; 257/706–727; 174/16.3, 252; 333/1.1, 246, 333/33, 238, 260; 342/372, 373, 368, 375; 343/853, 700 MS, 720
See application file for complete search history.

(56) References Cited

U.S. PATENT DOCUMENTS

| | | | |
|---|---|---|---|
| 3,091,743 A | 5/1963 | Wilkinson | |
| 3,665,480 A | 5/1972 | Fassett | |
| 4,489,363 A | 12/1984 | Goldberg | |
| 4,527,165 A | 7/1985 | deRonde | |
| 4,698,663 A | 10/1987 | Sugimoto et al. | |
| 4,706,094 A | 11/1987 | Kubick | |
| 4,751,513 A | 6/1988 | Daryoush et al. | |
| 4,835,658 A | 5/1989 | Bonnefoy | |
| 5,005,019 A | 4/1991 | Zaghloul et al. | |

(Continued)

FOREIGN PATENT DOCUMENTS

EP      0 481 417 A      4/1992

(Continued)

OTHER PUBLICATIONS

Notification of International Search Report and Written Opinion of the International Searching Authority for PCT/US2010/049261, dated Feb. 7, 2011, 11 pages.

(Continued)

*Primary Examiner* — Michail V Datskovskiy
(74) *Attorney, Agent, or Firm* — Daly, Crowley, Mofford & Durkee, LLP

(57) ABSTRACT

In one aspect, a system includes a first circuit board that includes integrated circuits, a first thermal spreader coupled to the integrated circuits of the first circuit board, a first compliant board coupled to the first circuit board, a second circuit board that includes integrated circuits and a second thermal spreader coupled to the integrated circuits of the second circuit board. The first circuit board and the first thermal spreader have a first thickness. The second daughter board and the second thermal spreader have a second thickness. The system further includes a second compliant board coupled to the second circuit board, a board assembly coupled to first and second compliant boards and a cold-plate assembly in contact with the first and second thermal spreaders. Either of the first or the second compliant boards is configured to expand or contract to account for the differences between the first and second thicknesses.

20 Claims, 9 Drawing Sheets

U.S. PATENT DOCUMENTS

| | | | |
|---|---|---|---|
| 5,055,852 A | 10/1991 | Dusseux et al. | |
| 5,099,254 A | 3/1992 | Tsukii et al. | |
| 5,276,455 A | 1/1994 | Fitzsimmons et al. | |
| 5,398,010 A | 3/1995 | Klebe | |
| 5,400,040 A | 3/1995 | Lane et al. | |
| 5,404,148 A | 4/1995 | Zwarts | |
| 5,451,969 A | 9/1995 | Toth et al. | |
| 5,459,474 A | 10/1995 | Mattioli et al. | |
| 5,488,380 A | 1/1996 | Harvey et al. | |
| 5,493,305 A | 2/1996 | Wooldridge et al. | |
| 5,563,613 A | 10/1996 | Schroeder et al. | |
| 5,592,363 A | 1/1997 | Atarashi et al. | |
| 5,646,826 A | 7/1997 | Katchmar | |
| 5,675,345 A | 10/1997 | Pozgay et al. | |
| 5,724,048 A | 3/1998 | Remondiere | |
| 5,786,792 A | 7/1998 | Bellus et al. | |
| 5,796,582 A | 8/1998 | Katchmar | |
| 5,854,607 A | 12/1998 | Kinghorn | |
| 5,907,304 A | 5/1999 | Wilson et al. | |
| 6,011,507 A | 1/2000 | Curran et al. | |
| 6,037,903 A | 3/2000 | Lange et al. | |
| 6,061,027 A | 5/2000 | Legay et al. | |
| 6,078,289 A | 6/2000 | Manoogian et al. | |
| 6,087,988 A | 7/2000 | Pozgay | |
| 6,091,373 A | 7/2000 | Raguenet | |
| 6,104,343 A | 8/2000 | Brookner et al. | |
| 6,127,985 A | 10/2000 | Guler | |
| 6,166,705 A | 12/2000 | Mast et al. | |
| 6,181,280 B1 | 1/2001 | Kadambi et al. | |
| 6,184,832 B1 | 2/2001 | Geyh et al. | |
| 6,208,316 B1 | 3/2001 | Cahill | |
| 6,211,824 B1 | 4/2001 | Holden et al. | |
| 6,218,214 B1 | 4/2001 | Panchou et al. | |
| 6,222,493 B1 | 4/2001 | Caille et al. | |
| 6,225,695 B1 | 5/2001 | Chia et al. | |
| 6,297,775 B1 | 10/2001 | Haws et al. | |
| 6,388,620 B1 | 5/2002 | Bhattacharyya | |
| 6,392,890 B1 | 5/2002 | Katchmar | |
| 6,424,313 B1 | 7/2002 | Navarro et al. | |
| 6,480,167 B2 | 11/2002 | Matthews | |
| 6,483,705 B2 | 11/2002 | Snyder et al. | |
| 6,611,180 B1 | 8/2003 | Puzella et al. | |
| 6,621,470 B1 | 9/2003 | Boeringer et al. | |
| 6,624,787 B2 | 9/2003 | Puzella et al. | |
| 6,661,376 B2 | 12/2003 | Maceo et al. | |
| 6,670,930 B2 | 12/2003 | Navarro | |
| 6,686,885 B1 | 2/2004 | Barkdoll et al. | |
| 6,703,976 B2 | 3/2004 | Jacomb-Hood et al. | |
| 6,711,814 B2 | 3/2004 | Barr et al. | |
| 6,731,189 B2 | 5/2004 | Puzella et al. | |
| 6,756,684 B2 | 6/2004 | Huang | |
| 6,856,210 B2 | 2/2005 | Zhu et al. | |
| 6,900,765 B2 | 5/2005 | Navarro et al. | |
| 6,943,330 B2 | 9/2005 | Ring | |
| 6,961,248 B2 | 11/2005 | Vincent et al. | |
| 6,995,322 B2 | 2/2006 | Chan et al. | |
| 7,030,712 B2 | 4/2006 | Brunette et al. | |
| 7,061,446 B1 | 6/2006 | Short, Jr. et al. | |
| 7,129,908 B2 | 10/2006 | Edward et al. | |
| 7,132,990 B2 | 11/2006 | Stenger et al. | |
| 7,180,745 B2 | 2/2007 | Mandel et al. | |
| 7,187,342 B2 | 3/2007 | Heisen et al. | |
| 7,298,235 B2 | 11/2007 | Hauhe et al. | |
| 7,348,932 B1* | 3/2008 | Puzella et al. | 343/853 |
| 7,417,598 B2 | 8/2008 | Navarro et al. | |
| 7,443,354 B2 | 10/2008 | Navarro et al. | |
| 7,444,737 B2 | 11/2008 | Worl | |
| 7,489,283 B2 | 2/2009 | Ingram et al. | |
| 7,508,338 B2 | 3/2009 | Pluymers et al. | |
| 7,597,534 B2 | 10/2009 | Hopkins | |
| 7,671,696 B1* | 3/2010 | Puzella et al. | 333/33 |
| 2002/0051342 A1 | 5/2002 | Kanada | |
| 2005/0110681 A1 | 5/2005 | Londre | |
| 2006/0268518 A1 | 11/2006 | Edward et al. | |
| 2007/0152882 A1 | 7/2007 | Hash et al. | |
| 2008/0106467 A1 | 5/2008 | Navarro et al. | |
| 2008/0106482 A1 | 5/2008 | Cherrette et al. | |
| 2008/0150832 A1 | 6/2008 | Ingram et al. | |
| 2008/0316139 A1 | 12/2008 | Blaser et al. | |
| 2010/0066631 A1* | 3/2010 | Puzella et al. | 343/853 |
| 2010/0126010 A1* | 5/2010 | Puzella et al. | 29/852 |
| 2010/0245179 A1 | 9/2010 | Puzella et al. | |
| 2011/0248796 A1* | 10/2011 | Pozgay | 333/137 |
| 2012/0063098 A1* | 3/2012 | Paquette et al. | 361/721 |
| 2012/0146862 A1* | 6/2012 | Danello et al. | 343/720 |

FOREIGN PATENT DOCUMENTS

| | | |
|---|---|---|
| EP | 1 764 863 A1 | 3/2007 |
| EP | 1 436 859 B1 | 8/2007 |
| EP | 1 978 597 A1 | 10/2008 |
| JP | 61 224504 A | 10/1986 |
| JP | 4-122107 A | 4/1992 |
| JP | 06-097710 | 4/1994 |
| JP | 07-212125 | 8/1995 |
| JP | 2000-138525 A | 5/2000 |
| JP | 2003179429 A | 6/2003 |
| JP | 2005 505963 | 2/2005 |
| KR | 1020010079872 A | 8/2001 |
| WO | WO 98/26642 | 6/1998 |
| WO | WO 99/66594 | 12/1999 |
| WO | WO 01/06821 A1 | 1/2001 |
| WO | WO 01/20720 A1 | 3/2001 |
| WO | WO 01/33927 A1 | 5/2001 |
| WO | WO 01/41257 A1 | 6/2001 |
| WO | WO 03/003031 A1 | 4/2003 |
| WO | WO 2007/136941 A2 | 11/2007 |
| WO | WO 2007/136941 A3 | 11/2007 |
| WO | WO 2008/010851 A2 | 1/2008 |
| WO | WO 2008/010851 A3 | 1/2008 |
| WO | WO 2008/036469 A1 | 3/2008 |

OTHER PUBLICATIONS

Div. Application (with translation of amended claims) as filed on Dec. 1, 2008 and assigned App. No. 10-2008-7029396.

Decision of Rejection dated Jul. 30, 2008 from KR Pat. App. No. 10-2004-7003900.

Notice of Trial Decision dated Mar. 23, 2010 from KR Pat. App. No. 10-2004-7003900.

EP Search Report for 06021905.2; dated Feb. 9, 2007; 8 page.

European Office Action dated Nov. 3, 2005 from EP Pat. App. No. 02800372.1.

Response to European Office Action filed Jan. 12, 2007 from EP Pat. App. No. 02800372.1.

European Office Action dated Oct. 18, 2007 from EPO Pat. App. No. 06021905.2.

Response to European Office Action dated Oct. 18, 2007 filed in the EPO on Aug. 11, 2008 from EP Pat. App. No. 06021905.2.

Response to European Office Action dated Mar. 19, 2009 filed in the EPO on Nov. 19, 2009 from EP Pat. App. No. 06021905.2.

European Office Action dated Feb. 18, 2010 from EPO Pat. App. No. 06021905.2.

Notice of Allowance dated Feb. 2, 2007 from EP Pat. App. No. 02800372.1.

Korean Office Action dated Oct. 31, 2007 from KR Pat. App. No. 10-2004-7003900.

Response to Korean Office Action filed Mar. 26, 2008 from KR Pat. App. No. 10-2004-7003900.

Korean Office Action dated Feb. 25, 2009 from KR Pat. App. No. 10-2008-7029396.

Korean Office Action dated Nov. 27, 2009 from KR Pat. App. No. 10-2008-7029396.

Japanese Office Action dated Mar. 7, 2007 from JP Pat. App. No. 2003-533378.

Japanese Office Action dated Feb. 15, 2008 from JP Pat. App. No. 2003-533378.

Japanese Office Action dated Feb. 18, 2009 from JP Pat. App. No. 2003-533378.

Response to Japanese Office Action filed Jul. 5, 2007 from JP App. No. 2003-533378.

Response to Japanese Office Action filed Jun. 19, 2009 from App JP App. No. 2003-533378.

PCT Search Report of the ISA for PCT/US2010/026861 dated Jun. 18, 2010; 6 pages.

PCT Written Opinion of the ISA for PCT/US2010/026861 dated Jun. 18, 2010; 5 pages.

Bash et al,; "Improving Heat Transfer From a Flip-Chip Package;" Technology Industry; Email Alert RSS Feed; Hewlett-Packard Journal, Aug. 1997; 3 pages.

Marsh et al.; "5.4 Watt GaAs MESFET MMIC for Phased Array Radar Systems;" 1997 Workshop on High Performance Electron Devices for Microwave and Optoelectronic Applications, Nov. 24-25, 1997; pp. 169-174.

Carter; "'Fuzz Button' Interconnects at Microwave and MM-Wave Frequencies;" IEEE Seminar; London, UK; Mar. 1-Mar. 6, 2000; 7 sheets.

Jerinic, et al.; "X-Band "Tile" Array for Mobile Radar;" internal Raytheon Company publication; Spring 2003; 4 pages.

Puzella, et al.; "Digital Subarray for Large Apertures;" slide presentation; internal Raytheon Company publication; Sep. 14, 2004; pp. 1-22.

Puzella; "Deliverable Demonstration Sub-Array;" slide presentation; internal Raytheon Company publication; Fall 2003; pp. 1-17.

PCT International Preliminary Examination Report and Written Opinion of the ISA for PCT/US2002/30677 dated Nov. 27, 2003; 10 pages.

PCT International Preliminary Examination Report mailed on Apr. 2, 2009 for PCT Pat. App. No. PCT/US2007/074795 filed on Jul. 31, 2007.

PCT Search Report mailed on Dec. 19, 2007 for PCT Pat. App. No. PCT/US2007/074795 filed on Jul. 31, 2007.

PCT Written Opinion mailed on Dec. 19, 2007 for PCT Pat. App. No. PCT/US2007/074795 filed on Jul. 31, 2007.

U.S. Appl. No. 61/163,002, filed Mar. 24, 2009.
U.S. Appl. No. 12/484,626, filed Jun. 15, 2009.
U.S. Appl. No. 12/482,061, filed Jun. 10, 2009.
U.S. Appl. No. 12/566,818, filed Sep. 25, 2009.
U.S. Appl. No. 12/948,858, filed Nov. 18, 2010.
U.S. Appl. No. 12/580,356, filed Oct. 16, 2009.
U.S. Appl. No. 12/880,350, filed Sep. 13, 2010
U.S. Appl. No. 12/694,450, filed Jan. 27, 2010.

* cited by examiner

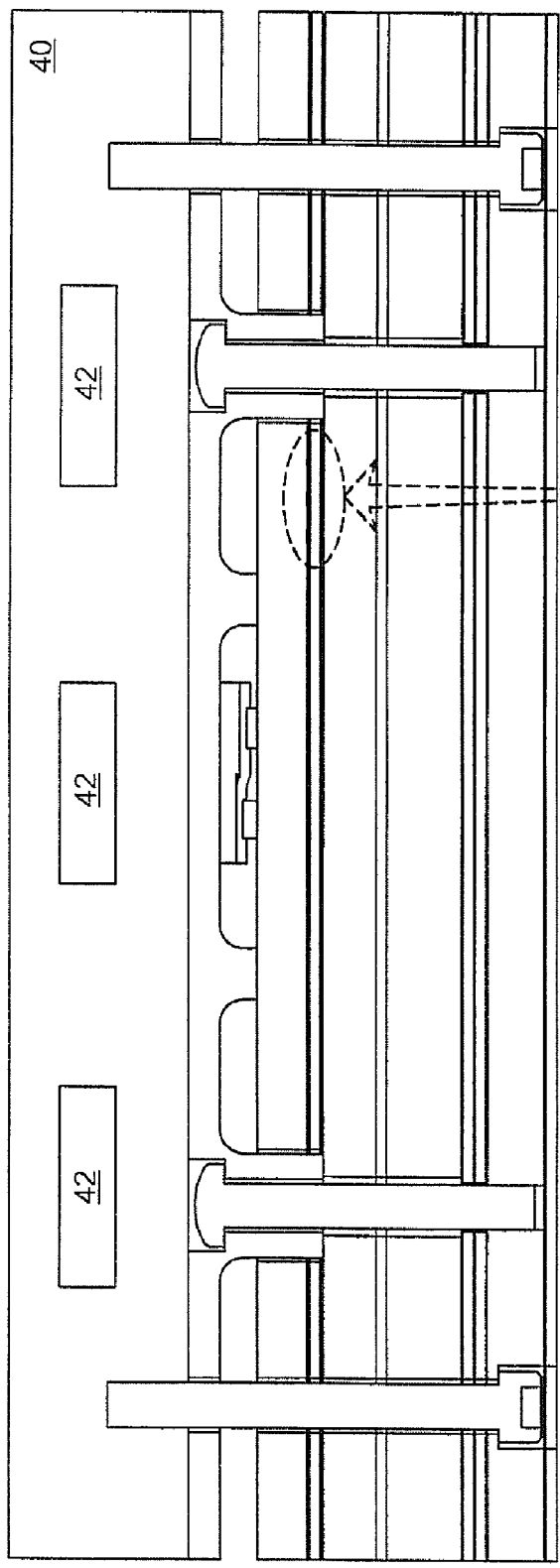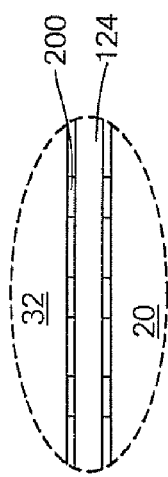
FIG. 5C
FIG. 5D

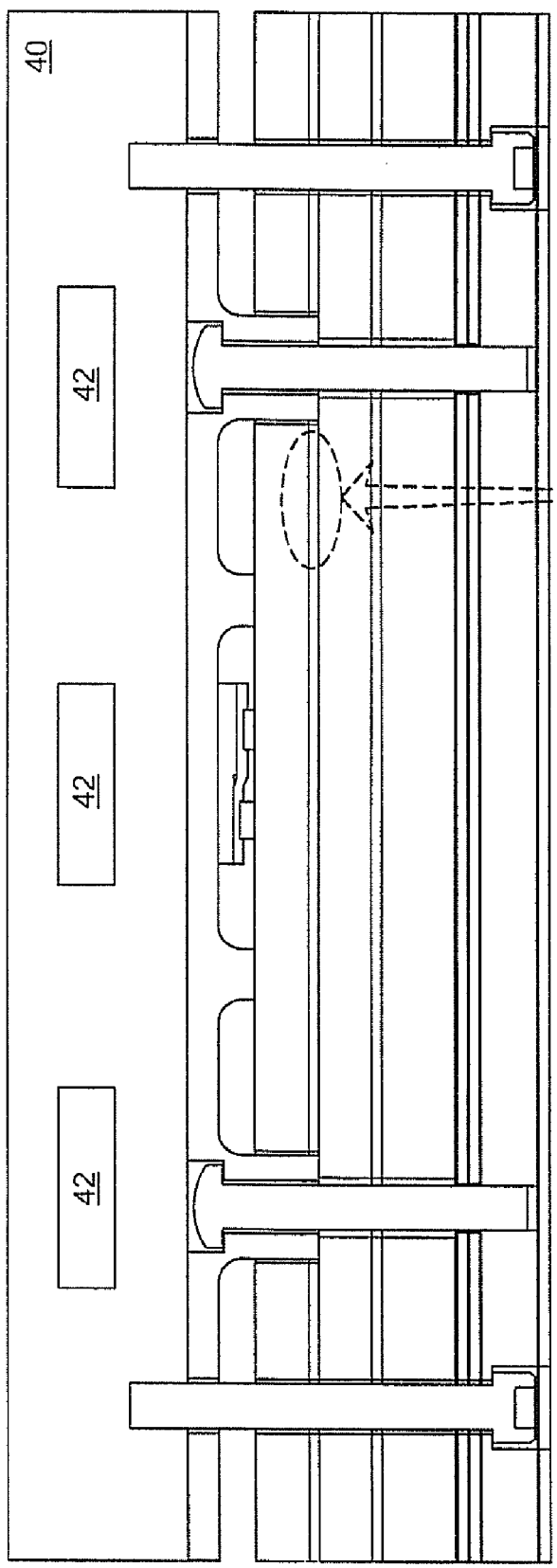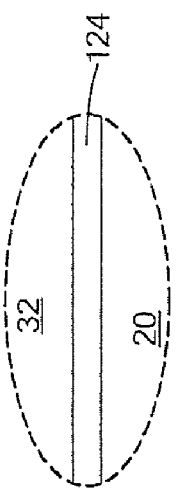
*FIG. 5E*
*FIG. 5F*

COOLING OF COPLANAR ACTIVE CIRCUITS

BACKGROUND

As is known in the art, a phased array antenna includes a plurality of active circuits spaced apart from each other by known distances. Each of the active circuits is coupled through a plurality of phase shifter circuits, amplifier circuits and/or other circuits to either or both of a transmitter and receiver. In some cases, the phase shifter, amplifier circuits and other circuits (e.g., mixer circuits) are provided in a so-called transmit/receive (T/R) module and are considered to be part of the transmitter and/or receiver.

The phase shifters, amplifier and other circuits (e.g., T/R modules) often require an external power supply (e.g., a DC power supply) to operate correctly. Thus, the circuits are referred to as "active circuits" or "active components." Accordingly, phased array antennas which include active circuits are often referred to as "active phased arrays."

Active circuits dissipate power in the form of heat. High amounts of heat can cause active circuits to be inoperable. Thus, active phased arrays must be cooled. In one example heat-sink(s) are attached to each active circuit to dissipate the heat.

SUMMARY

In one example, an active, electronically scanned array (AESA) panel architecture system includes a first daughter board that include active circuits, a first thermal spreader coupled to the active circuits of the first daughter board, a first compliant board coupled to the first daughter board, a second daughter board that includes active circuits, a second thermal spreader coupled to the active circuits of the second daughter board, a second compliant board coupled to the second daughter board, a mother board assembly coupled to first and second compliant boards and a cold-plate assembly in contact with the first thermal spreader and the second thermal spreader. The first daughter board and the first thermal spreader have a first thickness and the second daughter board and the second thermal spreader have a second thickness different from the first thickness. Either of the first or second compliant boards is configured to expand or contract to account for the differences between the first and second thicknesses.

In another aspect, an active, electronically scanned array (AESA) panel architecture system includes a first daughter board that includes active circuits, a first thermal spreader coupled to the active circuits of the first daughter board, a first RF interface board coupled to the first daughter board, a second daughter board that includes active circuits, a second thermal spreader coupled to the active circuits of the second daughter board, a second RF interface board coupled to the second daughter board, a mother board assembly coupled to first and second RF interface boards, and a cold-plate assembly in contact with the first and second thermal spreaders. The first daughter board and the first thermal spreader have a first thickness and the second daughter board and the second thermal spreader have a second thickness different from the first thickness. The first and second RF interface boards each include compliant elements on at least one side of the first RF interface board. The first and second RF interface boards are configured to expand or contract to account for the differences in thicknesses between the first thickness and the second thickness. The first RF interface board provides electrical coupling between the active circuits of the first daughter board and the mother board and the second RF interface board provides electrical coupling between the active circuits of the second daughter board and the mother board.

In a further aspect, a system includes a first circuit board that includes integrated circuits, a first thermal spreader coupled to the integrated circuits of the first circuit board, a first compliant board coupled to the first circuit board, a second circuit board that includes integrated circuits and a second thermal spreader coupled to the integrated circuits of the second circuit board. The first circuit board and the first thermal spreader have a first thickness. The second daughter board and the second thermal spreader have a second thickness. The system further includes a second compliant board coupled to the second circuit board, a board assembly coupled to first and second compliant boards and a cold-plate assembly in contact with the first and second thermal spreaders. Either of the first or the second compliant boards is configured to expand or contract to account for the differences between the first and second thicknesses.

DESCRIPTION OF THE DRAWINGS

FIG. 5A to 5F are cross-sectional views of single daughter board/thermal spreader assembly of FIG. 4A with different tolerance stack-ups.

DETAILED DESCRIPTION

Figure 1:
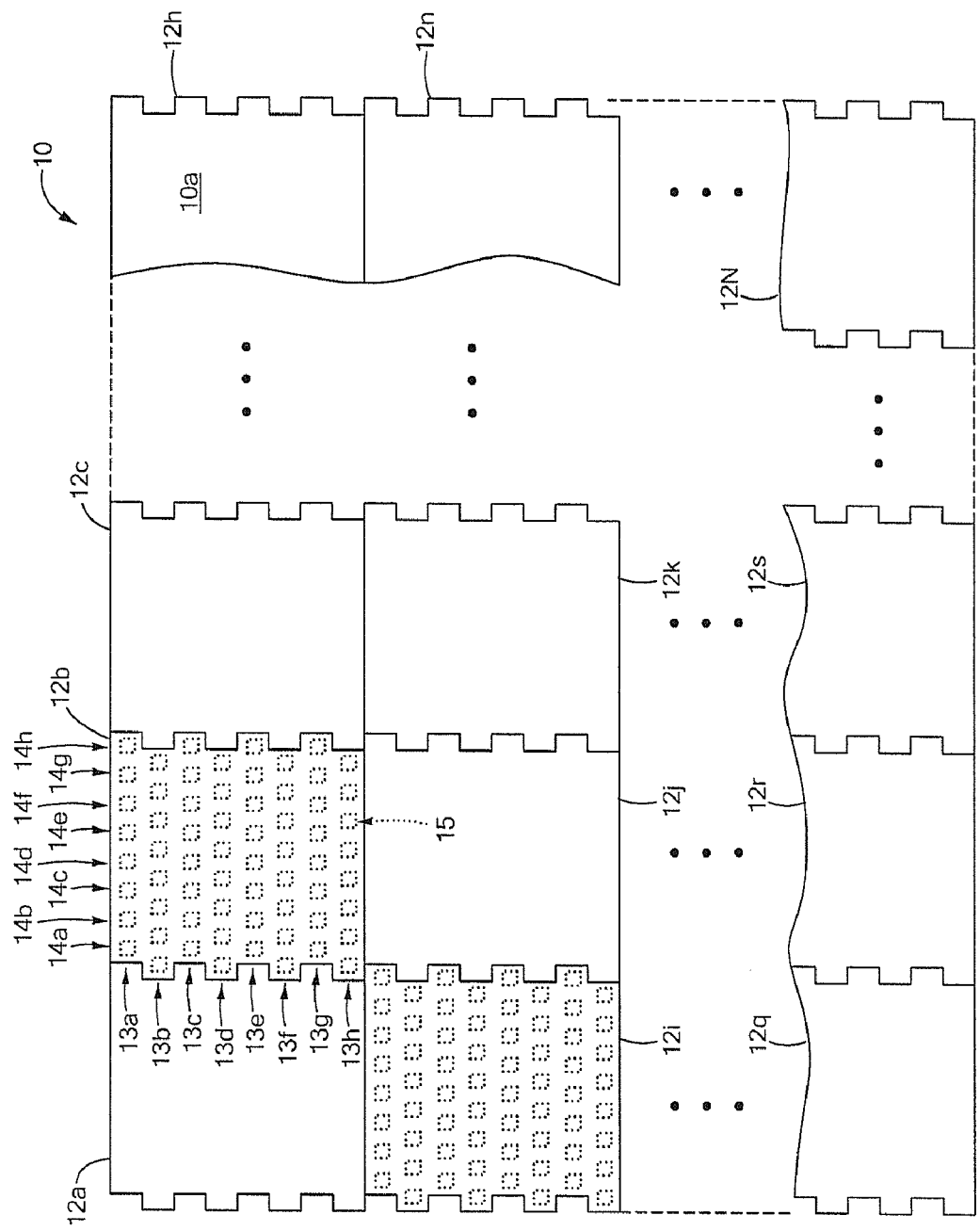
FIG. 1 is a plan view of an array antenna formed from a plurality of tile sub-arrays.

A "panel array" (or more simply "panel") refers to a multilayer printed wiring board (PWB) which includes an array of active circuits (or more simply "radiating elements" or "radiators"), as well as RF, logic and DC distribution circuits in one highly integrated PWB. A panel is also sometimes referred to herein as a tile array (or more simply, a "tile").

An array antenna may be provided from a single panel (or tile) or from a plurality of panels. In the case where an array antenna is provided from a plurality of panels, a single one of the plurality of panels is sometimes referred to herein as a "panel sub-array" (or a "tile sub-array").

Reference is sometimes made herein to an array antenna having a particular number of panels. It should of course, be appreciated that an array antenna may be comprised of any number of panels and that one of ordinary skill in the art will appreciate how to select the particular number of panels to use in any particular application.

It should also be noted that reference is sometimes made herein to a panel or an array antenna having a particular array shape and/or physical size or a particular number of active circuits. One of ordinary skill in the art will appreciate that the techniques described herein are applicable to various sizes and shapes of panels and/or array antennas and that any number of active circuits may be used.

Similarly, reference is sometimes made herein to panel or tile sub-arrays having a particular geometric shape (e.g., square, rectangular, round) and/or size (e.g., a particular number of active circuits) or a particular lattice type or spacing of active circuits. One of ordinary skill in the art will appreciate that the techniques described herein are applicable to various sizes and shapes of array antennas as well as to various sizes and shapes of panels (or tiles) and/or panel sub-arrays (or tile sub-arrays).

Thus, although the description provided herein below describes the inventive concepts in the context of an array antenna having a substantially square or rectangular shape and comprised of a plurality of tile sub-arrays having a substantially square or rectangular-shape, those of ordinary skill in the art will appreciate that the concepts equally apply to other sizes and shapes of array antennas and panels (or tile sub-arrays) having a variety of different sizes, shapes, and types of elements. Also, the panels (or tiles) may be arranged in a variety of different lattice arrangements including, but not limited to, periodic lattice arrangements or configurations (e.g., rectangular, circular, equilateral or isosceles triangular and spiral configurations) as well as non-periodic or other geometric arrangements including arbitrarily shaped array geometries.

Reference is also sometimes made herein to the array antenna including an antenna element (active circuit) of a particular type, size and/or shape. For example, one type of radiating element is a so-called patch antenna element having a square shape and a size compatible with operation at a particular frequency (e.g., 10 GHz) or range of frequencies (e.g., the X-band frequency range). Reference is also sometimes made herein to a so-called "stacked patch" antenna element. Those of ordinary skill in the art will recognize, of course, that other shapes and types of antenna elements (e.g., an antenna element other than a stacked patch antenna element) may also be used and that the size of one or more active circuits may be selected for operation at any frequency in the RF frequency range (e.g., any frequency in the range of about 1 GHz to about 100 GHz). The types of radiating elements which may be used in the antenna of the present invention include but are not limited to notch elements, dipoles, slots or any other antenna elements (regardless of whether the antenna element is a printed circuit element) known to those of ordinary skill in the art. It should also be appreciated that the active circuits in each panel or tile sub-array can be provided having any one of a plurality of different antenna element lattice arrangements including periodic lattice arrangements (or configurations) such as rectangular, square, triangular (e.g., equilateral or isosceles triangular), and spiral configurations as well as non-periodic or arbitrary lattice arrangements. Applications of at least some examples of the panel array (sometimes referred to as a "tile array") architectures described herein include, but are not limited to, radar, electronic warfare (EW) and communication systems for a wide variety of applications including ship based, airborne, missile and satellite applications. It should thus be appreciated that the panel (or tile sub-array) described herein can be used as part of a radar system or a communications system.

At least some examples as described herein are applicable, but not limited to, military, airborne, shipborne, communications, unmanned aerial vehicles (UAV) and/or commercial wireless applications.

The tile sub-arrays to be described herein below can also utilize embedded circulators; a slot-coupled, polarized egg-crate radiator; a single integrated monolithic microwave integrated circuit (MMIC); and a passive radio frequency (RF) circuit architecture. For example, as described further herein, technology described in the following commonly assigned United States Patents can be used in whole or in part and/or adapted to be used with at least some embodiments of the tile subarrays described herein: U.S. Pat. No. 6,611,180, entitled "Embedded Planar Circulator"; U.S. Pat. No. 6,624,787, entitled "Slot Coupled, Polarized, Egg-Crate Radiator"; and/or U.S. Pat. No. 6,731,189, entitled "Multilayer stripline radio frequency circuits and interconnection methods." Each of the above patents is hereby incorporated herein by reference in their entireties.

Referring now to FIG. 1, an array antenna 10 is comprised of a plurality of tile sub-arrays 12a-12N. It should be appreciated that in this example, N total tile sub-arrays 12 include the entire array antenna 10. In one particular example, the total number of tile sub-arrays is sixteen tile sub-arrays (i.e., N=16). The particular number of tile sub-arrays 12 used to provide a complete array antenna can be selected in accordance with a variety of factors including, but not limited to, the frequency of operation, array gain, the space available for the array antenna and the particular application for which the array antenna 10 is intended to be used. Those of ordinary skill in the art will appreciate how to select the number of tile sub-arrays 12 to use in providing a complete array antenna.

As illustrated in tiles 12b and 12i, in the example of FIG. 1, each tile sub-array 12a-12N includes eight rows 13a-13h of active circuits 15 (also known as antenna elements) with each row containing eight active circuits 15. Each of the tile sub-arrays 12a-12N is thus said to be an eight by eight (or 8×8) tile sub-array. It should be noted that each active circuit 15 is shown in phantom in FIG. 1 since the active circuits 15 are not directly visible on the exposed surface (or front face) of the array antenna 10. Thus, in this particular example, each tile sub-array 12a-12N includes sixty-four (64) active circuits. In the case where the array 10 includes sixteen (16) such tiles, the array 10 includes a total of one-thousand and twenty-four (1,024) active circuits 15.

In another example, each of the tile sub-arrays 12a-12N includes 16 active circuits. Thus, in the case where the array 10 includes sixteen (16) such tiles and each tiles includes sixteen (16) active circuits 15, the array 10 includes a total of two-hundred and fifty-six (256) active circuits 15.

In view of the above examples, it should thus be appreciated that each of the tile sub-arrays can include any desired number of active circuits 15. The particular number of active circuits to include in each of the tile sub-arrays 12a-12N can be selected in accordance with a variety of factors including but not limited to the desired frequency of operation, array gain, the space available for the antenna and the particular application for which the array antenna 10 is intended to be used and the size of each tile sub-array 12. For any given application, those of ordinary skill in the art will appreciate how to select an appropriate number of radiating active circuits to include in each tile sub-array. The total number of active circuits 15 included in an antenna array such as antenna array 10 depends upon the number of tiles included in the antenna array and as well as the number of active circuits included in each tile.

Each tile sub-array is electrically autonomous (except any mutual coupling which occurs between active circuits 15 within a tile and on different tiles). Thus, the RF feed circuitry which couples RF energy to and from each radiator on a tile is incorporated entirely within that tile (i.e., all of the RF feed and beamforming circuitry which couples RF signals to and from active circuits 15 in tile 12b are contained within tile 12b). In one example, each tile includes one or more RF connectors and the RF signals are provided to the tile through the RF connector(s) provided on each tile sub-array.

Also, signal paths for logic signals and signal paths for power signals which couple signals to and from transmit/receive (T/R) circuits are contained within the tile in which the T/R circuits exist. RF signals are provided to the tile through one or more power/logic connectors provided on the tile sub-array.

The RF beam for the entire array 10 is formed by an external beamformer (i.e., external to each of the tile subarrays 12) that combines the RF outputs from each of the tile sub-arrays 12a-12N. As is known to those of ordinary skill in the art, the beamformer may be conventionally implemented as a printed wiring board stripline circuit that combines N sub-arrays into one RF signal port (and hence the beamformer may be referred to as a 1:N beamformer).

It should be appreciated that the examples of the tile sub-arrays described herein (e.g., tile sub-arrays 12a-12N) differ from conventional array architectures in that the microwave circuits of the tile sub-arrays are contained in circuit layers which are disposed in planes that are parallel to a plane defined by a face (or surface) of an array antenna (e.g., surface 10a of array antenna 10) made up from the tiles. In FIG. 1, for example, the circuits 15 provided on the layers of circuit boards from which the tiles 12a-12N are provided are all parallel to the surface 10a of array antenna 10. By utilizing circuit layers that are parallel to a plane defined by a face of an array antenna, the tile architecture approach results in an array antenna having a reduced profile (i.e., a thickness which is reduced compared with the thickness of conventional array antennas).

Advantageously, the tile sub-array embodiments described herein can be manufactured using standard printed wiring board (PWB) manufacturing processes to produce highly integrated, passive RF circuits, using commercial, off-the-shelf (COTS) microwave materials, and highly integrated, active monolithic microwave integrated circuits (MMIC's). This results in reduced manufacturing costs. Array antenna manufacturing costs can also be reduced since the tile sub-arrays can be provided from relatively large panels or sheets of PWBs using conventional PWB manufacturing techniques.

Figure 2A:
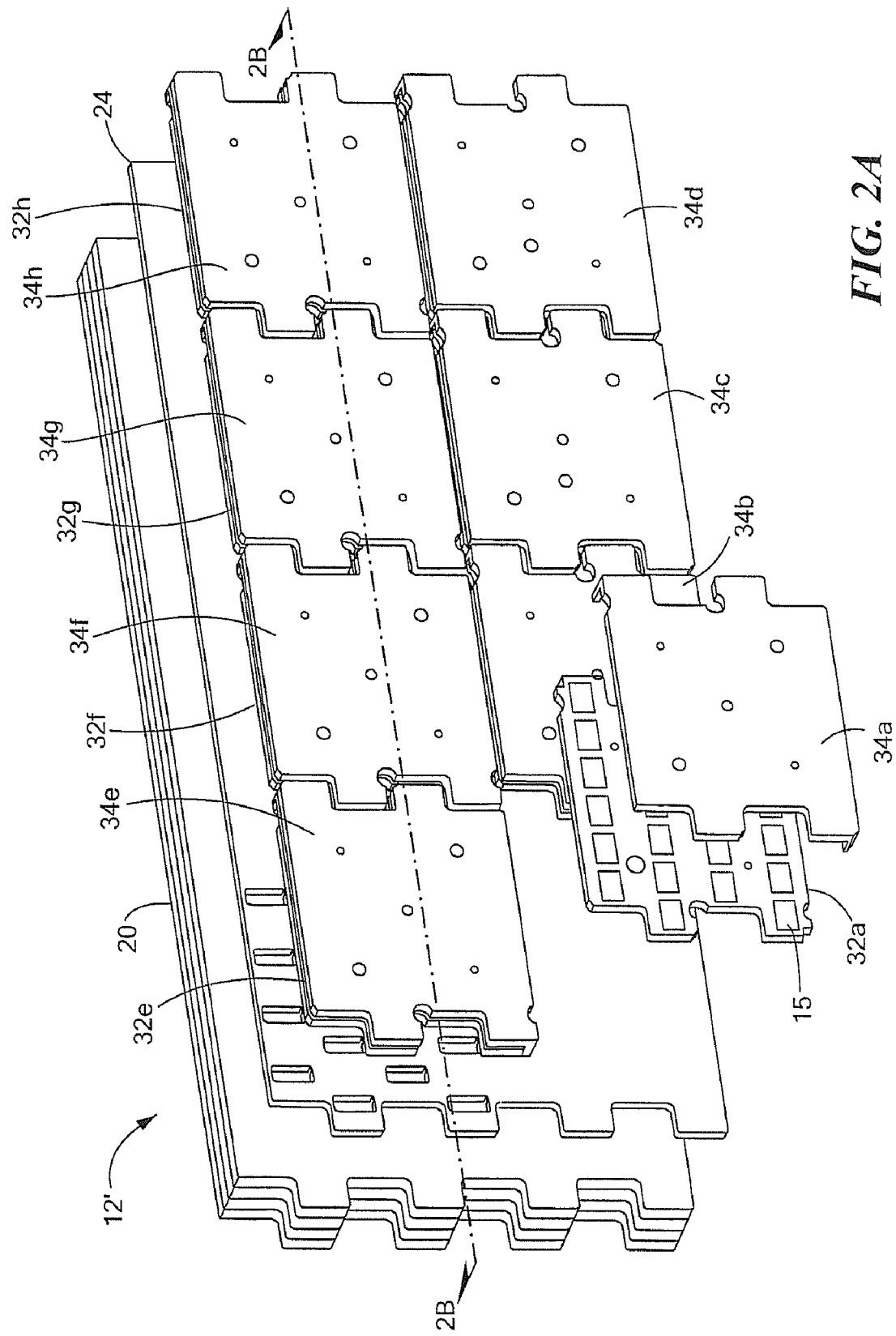
FIG. 2A is a partially exploded perspective view of an example of a tile sub-array.
Figure 2B:
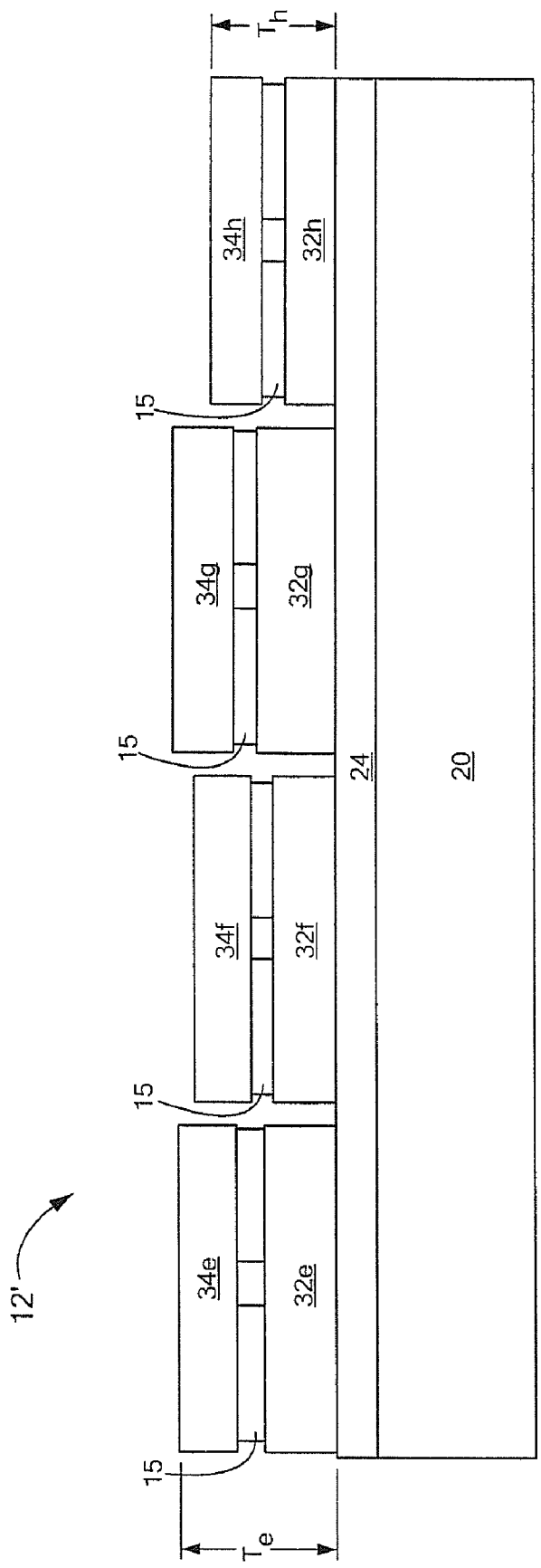
FIG. 2B is a cross-sectional view of the tile sub-array of FIG. 2A taken along lines 2B-2B.
Figure 2C:
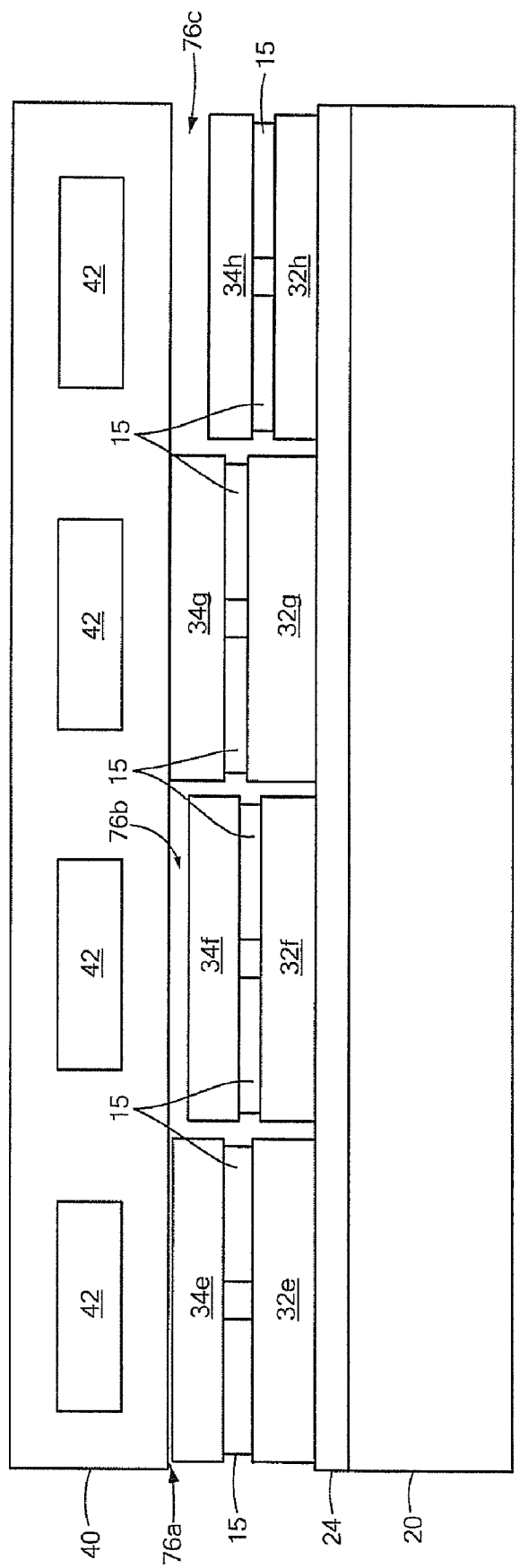
FIG. 2C is a cross-sectional view of the tile sub-array of FIG. 2B with a cold plate.

Referring to FIGS. 2A to 2C, in one particular example of the tile sub-arrays 12a-12N is a tile sub-array 12'. The tile sub-array 12' includes a mother board 20, an RF interface board 24, eight daughter boards (e.g., a daughter board 32a-32h) with active circuits 15 on each daughter board and eight thermal spreaders (e.g., a thermal spreader 34a-34h) attached to active circuits 15 of a corresponding daughter board. In one example, the active circuits 15 are secured to the thermal spreaders 34a-34h using solder techniques described in U.S. patent application Ser. No. 12/580,356 entitled "Cooling Active Circuits" which is incorporated herein in it entirety.

In one example, each daughter board 32a-32h includes sixteen active circuits 15. Instead of having one large daughter board with active circuits 15 connected to one thermal spreader, this configuration increases yield during manufacturing by reducing the size of the daughter board into smaller pieces. In addition, it is easier to rework problems with smaller daughter boards as opposed to larger one piece daughter boards. For example, it is more cost effective to throw away sixteen active circuits 15 because of an active circuit failure than one hundred twenty-eight active circuits.

Cooling a number of substantially coplanar active circuits 15 (e.g., integrated circuits) with a single cold plate in direct contact with top surfaces of the thermal spreaders 34a-34h is difficult because of the many tolerances that exist resulting from height variations (thicknesses). In particular, a cold plate 40 with channels 42 for receiving coolant is unable to make contact with all of the thermal spreaders 34e-34h (FIG. 2C) leaving spaces 76a-76c between the thermal spreaders 34e, 34f, 34h and the cold plate 40. By not being in direct contact with the cold plate 40, the thermal spreaders 34e, 34f, 34h do not efficiently transfer heat away from the active circuits 15.

In one example, the active circuits 15, the thermal spreaders 34 and the daughter boards 32 may have different thicknesses. With respect to FIG. 2B, the thickness, $T_h$, which includes thicknesses of the thermal spreader 34h, the daughter board 32h and active circuits 15 is different from the thickness, $T_e$, which includes thicknesses of the thermal spreader 34e, the daughter board 32e and active circuits 15. In one particular example, the daughter boards 32a-32h, which are about 0.100 inches thick have thickness tolerances of +/−0.01 inches and the thermal spreaders 34a-34h have thickness tolerances of +/−0.001 inches resulting in a total thickness tolerance of +/−0.011 inches. As described herein, a compliant member may be used to compensate for varying thicknesses between the daughter board and thermal spreader subassemblies, e.g., a compliant member that compensates for the 0.011 inches in the previous example. While this disclosure describes cooling active circuits in an environment of an active, electronically scanned array (AESA) panel architecture system, the techniques described herein may be used in any environment to cool multiple objects of varying thicknesses and/or are substantially coplanar.

Figure 3:
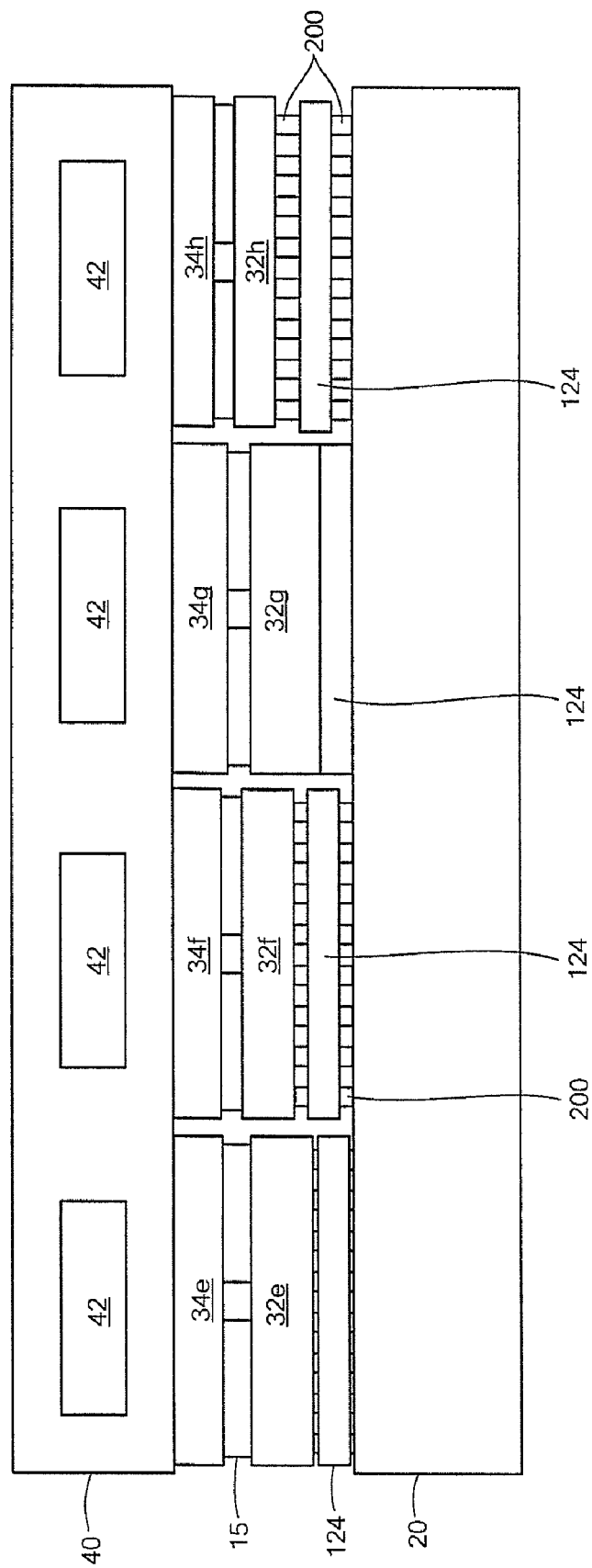
FIG. 3 is a cross-sectional view of a tile sub-array with the cold plate and a compliant member.

Referring to FIG. 3, one technique to eliminate the air spaces 76a-76c (FIG. 2C) between the thermal spreaders 34a-34h and the cold plate 40 is to use the compliant member between the mother board 20 and the active circuits 15. In one example, an RF interface board 124 is the compliant member. For example, the air spaces 76a-76c (FIG. 2C) between the thermal spreaders 34e-34h and the cold plate 40 are substantially eliminated (e.g., reduced to less than 0.002 inches) because the RF interface board 124 can compensate for the variances in the thicknesses of the different thermal spreader/daughter board assemblies. In one particular example, each side of the RF interface board 124 includes a plurality of conductive elastomeric contacts 200 capable of providing an adequate RF interconnect and having elastic properties such to minimize compression set over extended time and temperature ranges. The RF interface board 124 including the conductive elastomeric contacts 200 is also electrically conductive so that RF signals generated by the actives circuits 15 can be transmitted to the circulator/radiator assembly 150 (see FIG. 4). In one example, the conductive elastomeric contacts 200 include a compliant material such as a silver-filled elastomer with a Shore A durometer of about 90.

In another example, the interface board 124, including the conductive elastomeric contacts 200, is also electrically conductive and configured to provide an RF insertion loss of less than 0.1 dB. In other examples, only one side of the RF interface board 124 includes the conductive elastomeric contacts 200 and the opposite side is either integrated with the daughter board 32 or the mother board 20.

Figure 4A:
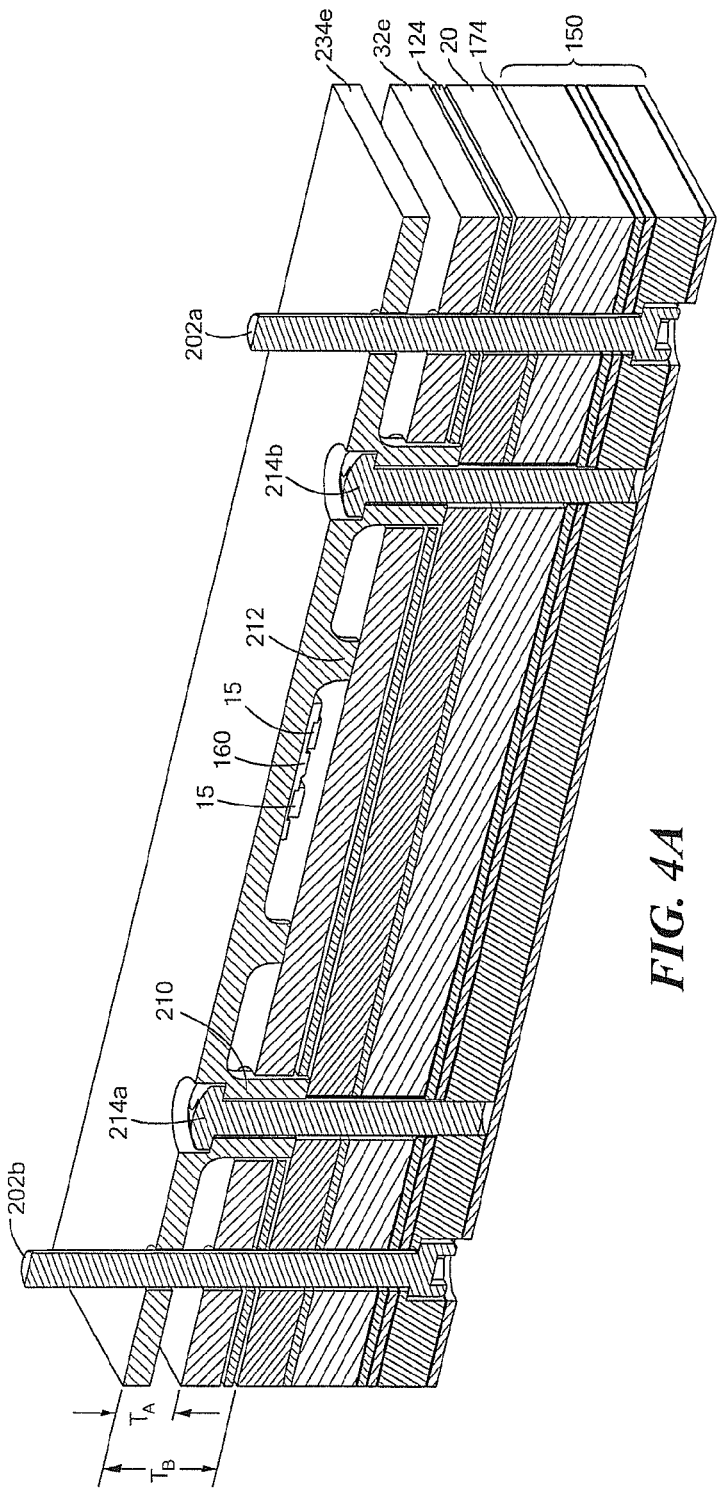
FIG. 4A is a cross-sectional view of an example of a single daughter board/thermal spreader assembly mounted to a mother board.
Figure 4B:
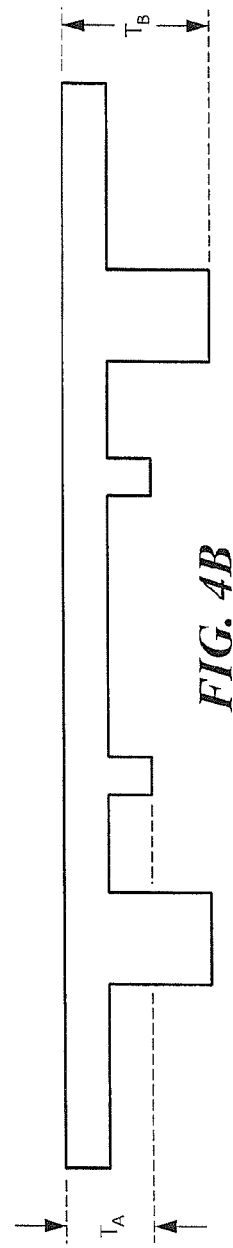
FIG. 4B is a cross-sectional view of a thermal spreader of FIG. 4B.

Referring to FIGS. 4A and 4B, the thermal spreaders/daughter board subassemblies may be configured in other ways. In particular, unlike FIG. 3, which depicts a simplistic thermal spreader 34e, FIGS. 4A and 4B depict a thermal spreader 234e, which is a more complex thermal spreader configuration. The thermal spreader 234e/daughter board 32e is coupled to the compliant RF interface board 124, the mother board 20, an RF interface board 24 and to a circulator/radiator assembly 150. As used herein an RF panel assembly includes the circulator/radiator assembly 150, an interface 174, the mother board 20, the compliant RF interface board 124, the daughter board 32e, and the thermal spreader 234e.

The thermal spreaders (e.g., the thermal spreader 234e shown in FIG. 4) include bosses (e.g., a boss 210a, a boss 210b, a boss 212a and a boss 212b). The bosses 210a, 210b are configured to control any gaps between the thermal spreader 234e and the cold plate 40 (not shown in FIG. 4). The bosses 212a, 212b are configured to control any gaps between the active circuits 15 and the thermal spreader 234e.

In one example, either of the bosses 210a, 210b have a thickness tolerance, $T_B$, of about +/−0.001 inches and either of the bosses 212a, 212b have a thickness tolerance, $T_A$, of about +/−0.001 inches. If the daughter board 32e has a thickness tolerance of about +/−0.010 inches, then the compliant RF interface board 124 is configured to have an adjustable thickness of at least +/−0.012 inches.

Screws 214a, 214b are used to mount the thermal spreader 234e/daughter board 32e subassembly to the mother board 20 and the circulator/radiator assembly 150. The screws 214a, 214b extend through the bosses 210a, 210b respectively and through the mother board 20, the interface 174 and the circulator/radiator assembly 150. In one example, the screws 214a, 214b pass through a clearance hole (not shown) in the respective bosses 210a, 210b and the mother board 20, RF interface board 124 and engage threads (not shown) in the circulator/radiator assembly 150.

Screws 202a, 202b are used to mount the RF panel assembly to the cold plate 40 (not shown in FIG. 4A). In one example, the screws 202a, 202b pass through clearance holes (not shown) in the circulator/radiator assembly 150, the interface 74, the mother board 20, the compliant RF interface board 124, the daughter board 32e, the thermal spreader 234e and engage threads (not shown) in the cold plate 40 (not shown in FIG. 4A).

The screws 202a, 202b, 214a, 214b perform a clamping function ensuring that the RF interface board 124 has adequate compression for RF transmission and control the gap between the thermal spreader 234e and the cold plate 40 to ensure efficient transfer of heat.

Figure 5B:
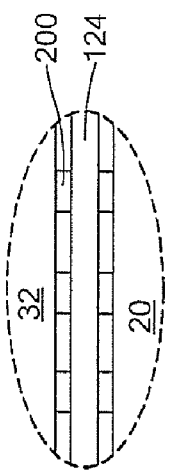
Figure 5A:
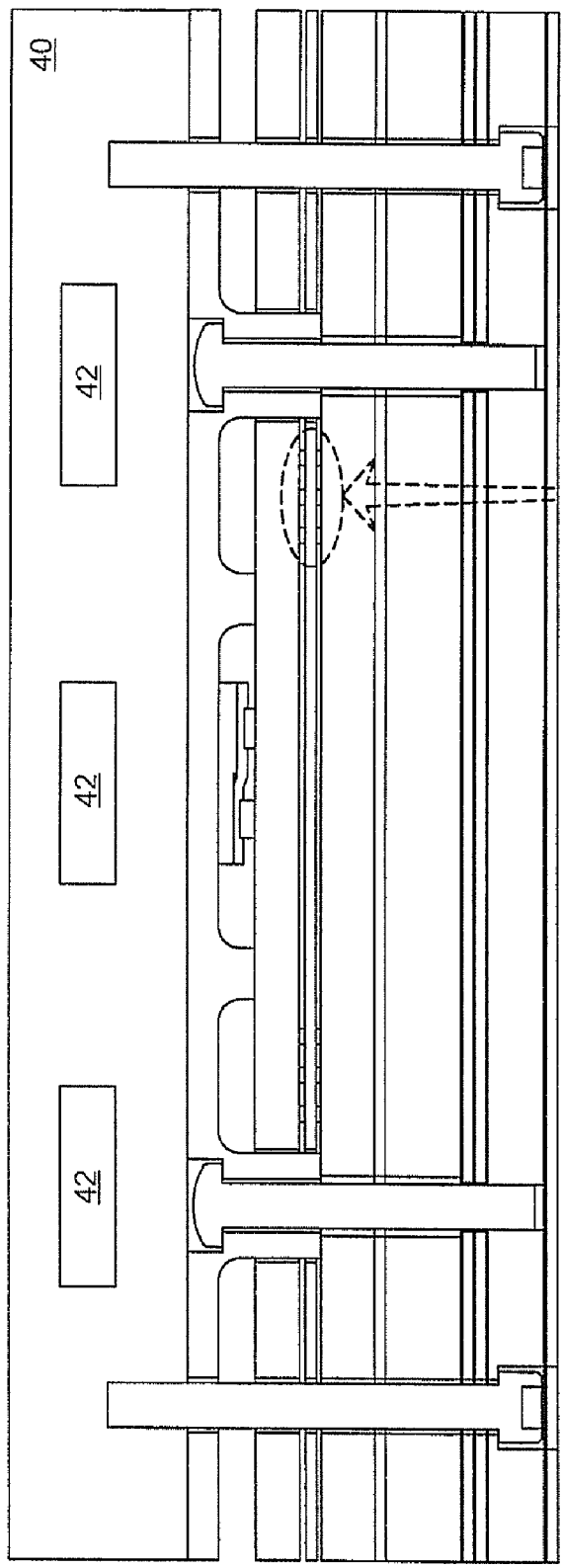

FIG. 5A depicts a minimum tolerance stack-up with the RF interface board 124 under minimum compression. FIG. 5B depicts a nominal tolerance stake-up with the RF interface board 124 under nominal compression. FIG. 5C depicts a maximum tolerance stake-up with the RF interface board 124 under maximum compression.

While screws 202a, 202b, 214a, 214b have been described one of ordinary skill in the art would recognize that the screws 202a, 202b, 214a, 214b may be replaced with fasteners (e.g., standoffs and so forth) or other clamping structures. Also, one of ordinary skill in the art would recognize other known methods or techniques to ensure contact between the cold plate and the thermal spreaders and to ensure compression between the daughter board 234e, mother board 20 and the compliant RF interface board 124.

The processes described herein are not limited to the specific embodiments described. Elements of different embodiments described herein may be combined to form other embodiments not specifically set forth above. Other embodiments not specifically described herein are also within the scope of the following claims.

What is claimed is:

1. An active, electronically scanned array (AESA) panel architecture system comprising:
   a first daughter board comprising active circuits;
   a first thermal spreader coupled to the active circuits of the first daughter board, the first daughter board and the first thermal spreader having a first thickness;
   a first compliant board coupled to the first daughter board;
   a second daughter board comprising active circuits;
   a second thermal spreader coupled to the active circuits of the second daughter board, the second daughter board and the second thermal spreader having a second thickness different from the first thickness;
   a second compliant board coupled to the second daughter board;
   a mother board assembly coupled to first and second compliant boards; and
   a cold-plate assembly in contact with the first thermal spreader and the second thermal spreader,
   wherein either of the first compliant board or the second compliant board is configured to expand or contract to account for the differences in thicknesses between the first thickness and the second thickness.

2. The system of claim 1, further comprising a fastener securing the mother board assembly to the cold-plate assembly and extending through one of the first or second daughter board.

3. The system of claim 1, further comprising a fastener securing the mother board assembly to one of the first or the second thermal spreader.

4. The system of claim 1 wherein the first or second compliant board comprises an RF interface board.

5. The system of claim 1 wherein the first or second compliant board comprises conductive elastomeric contacts on at least one side of the first compliant board.

6. The system of claim 1 wherein the conductive elastomeric contacts comprises a silver-filled elastomer.

7. The system of claim 1 wherein the elastomer has a Shore A durometer of about 90.

8. The system of claim 1 wherein the first or second compliant board and the conductive elastomeric contacts are electrically conductive and configured to provide an RF insertion loss of less than 0.1 dB.

9. The system of claim 1 wherein the first thermal spreader comprises a boss that interfaces with the first daughter board to control gaps between the active circuits of the first daughter board and the first thermal spreader.

10. The system of claim 1 wherein the first thermal spreader comprises a first boss that interfaces with the mother board to control a gap between the cold-plate assembly and the first thermal spreader.

11. An active, electronically scanned array (AESA) panel architecture system comprising:
   a first daughter board comprising active circuits;
   a first thermal spreader coupled to the active circuits of the first daughter board, the first daughter board and the first thermal spreader having a first thickness;
   a first RF interface board coupled to the first daughter board, the first RF interface board comprising compliant elements on at least one side of the first RF interface board;
   a second daughter board comprising active circuits;
   a second thermal spreader coupled to the active circuits of the second daughter board, the second daughter board and the second thermal spreader having a second thickness different from the first thickness;
   a second RF interface board coupled to the second daughter board, the second RF interface board comprising compliant elements on at least one side of the second RF interface board;

a mother board assembly coupled to first and second RF interface boards; and a cold-plate assembly in contact with the first thermal spreader and the second thermal spreader, wherein the first and second RF interface boards are configured to expand or contract to account for the differences in thicknesses between the first thickness and the second thickness, wherein the first RF interface board provides electrical coupling between the active circuits of the first daughter board and the mother board, and wherein the second RF interface board provides electrical coupling between the active circuits of the second daughter board and the mother board.

12. The system of claim 11, further comprising a first fastener securing the mother board assembly to the cold-plate assembly and extending through one of the first or second daughter board.

13. The system of claim 12, further comprising a second fastener securing one of the first or the second thermal spreader to the mother board assembly.

14. The system of claim 11 wherein the first thermal spreader comprises a first boss that interfaces with the first daughter board to control gaps between the active circuits of the first daughter board and the first thermal spreader.

15. The system of claim 11 wherein the first thermal spreader comprises a second boss that interfaces with the mother board to control a gap between the cold-plate assembly and the first thermal spreader.

16. A system comprising:
a first circuit board comprising integrated circuits;
a first thermal spreader coupled to the integrated circuits of the first circuit board, the first circuit board and the first thermal spreader having a first thickness;
a first compliant board coupled to the first circuit board;
a second circuit board comprising integrated circuits;
a second thermal spreader coupled to the integrated circuits of the second circuit board, the second circuit board and the second thermal spreader having a second thickness different from the first thickness;
a second compliant board coupled to the second circuit board;
a board assembly coupled to first and second compliant boards; and
a cold-plate assembly in contact with the first thermal spreader and the second thermal spreader,
wherein either of the first compliant board or the second compliant board is configured to expand or contract to account for the differences in thicknesses between the first thickness and the second thickness.

17. The system of claim 16, further comprising a fastener securing the board assembly to the cold-plate assembly and extending through one of the first or second circuit board.

18. The system of claim 16, further comprising a fastener securing the board assembly to one of the first or the second thermal spreader.

19. The system of claim 16 wherein the first or second compliant board comprises conductive elastomeric contacts on at least one side of the first compliant board.

20. The system of claim 16 wherein the first thermal spreader comprises a first boss that interfaces with the first circuit board to control gaps between the integrated circuits of the first circuit board and the first thermal spreader.
wherein the first thermal spreader further comprises a second boss that interfaces with the board assembly to control a gap between the cold-plate assembly and the first thermal spreader.

* * * * *